United States Patent
Lee

(10) Patent No.: US 11,889,697 B2
(45) Date of Patent: Jan. 30, 2024

(54) 3D NON-VOLATILE SEMICONDUCTOR DEVICE AND MANUFACTURING METHOD OF THE DEVICE

(71) Applicant: SK hynix Inc., Icheon-si (KR)

(72) Inventor: Nam Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/900,429

(22) Filed: Aug. 31, 2022

(65) Prior Publication Data

US 2022/0415910 A1    Dec. 29, 2022

Related U.S. Application Data

(62) Division of application No. 16/863,608, filed on Apr. 30, 2020, now Pat. No. 11,462,557.

(30) Foreign Application Priority Data

Nov. 26, 2019    (KR) ........................ 10-2019-0153581

(51) Int. Cl.
*H10B 43/27*    (2023.01)
*H10B 43/35*    (2023.01)
*H10B 43/23*    (2023.01)

(52) U.S. Cl.
CPC ............. *H10B 43/27* (2023.02); *H10B 43/23* (2023.02); *H10B 43/35* (2023.02)

(58) Field of Classification Search
CPC .............. H01L 27/11578–11582; H10B 43/27
See application file for complete search history.

(56) References Cited

U.S. PATENT DOCUMENTS

| | | | |
|---|---|---|---|
| 9,437,606 B2 | 9/2016 | Makala et al. | |
| 10,199,359 B1 | 2/2019 | Sakakibara et al. | |
| 2012/0119283 A1 | 5/2012 | Lee et al. | |
| 2017/0162591 A1* | 6/2017 | Choi | H01L 21/31144 |
| 2017/0162594 A1 | 6/2017 | Ahn | |
| 2018/0040629 A1 | 2/2018 | Eom | |
| 2019/0027492 A1 | 1/2019 | Lee | |
| 2019/0115362 A1* | 4/2019 | Choi | H10B 43/50 |

FOREIGN PATENT DOCUMENTS

| | | |
|---|---|---|
| CN | 105977257 A | 9/2016 |
| CN | 109671711 A | 4/2019 |
| CN | 110785851 A | 2/2020 |
| KR | 1020160109971 A | 9/2016 |
| KR | 1020190107975 A | 9/2019 |

* cited by examiner

*Primary Examiner* — Robert G Bachner
*Assistant Examiner* — Molly K Re
(74) *Attorney, Agent, or Firm* — William Park & Associates Ltd.

(57) ABSTRACT

A semiconductor device and a method of manufacturing the semiconductor device are provided. The semiconductor device includes a source structure formed on a base, an etch prevention layer formed on the source structure, bit lines, a stack structure located between the etch prevention layer and the bit lines and including conductive layers and insulating layers that are alternately stacked on each other, and a channel structure passing through the stack structure and the etch prevention layer, wherein a lower portion of the channel structure is located in the source structure and a sidewall of the lower portion of the channel structure is in direct contact with the source structure.

8 Claims, 11 Drawing Sheets

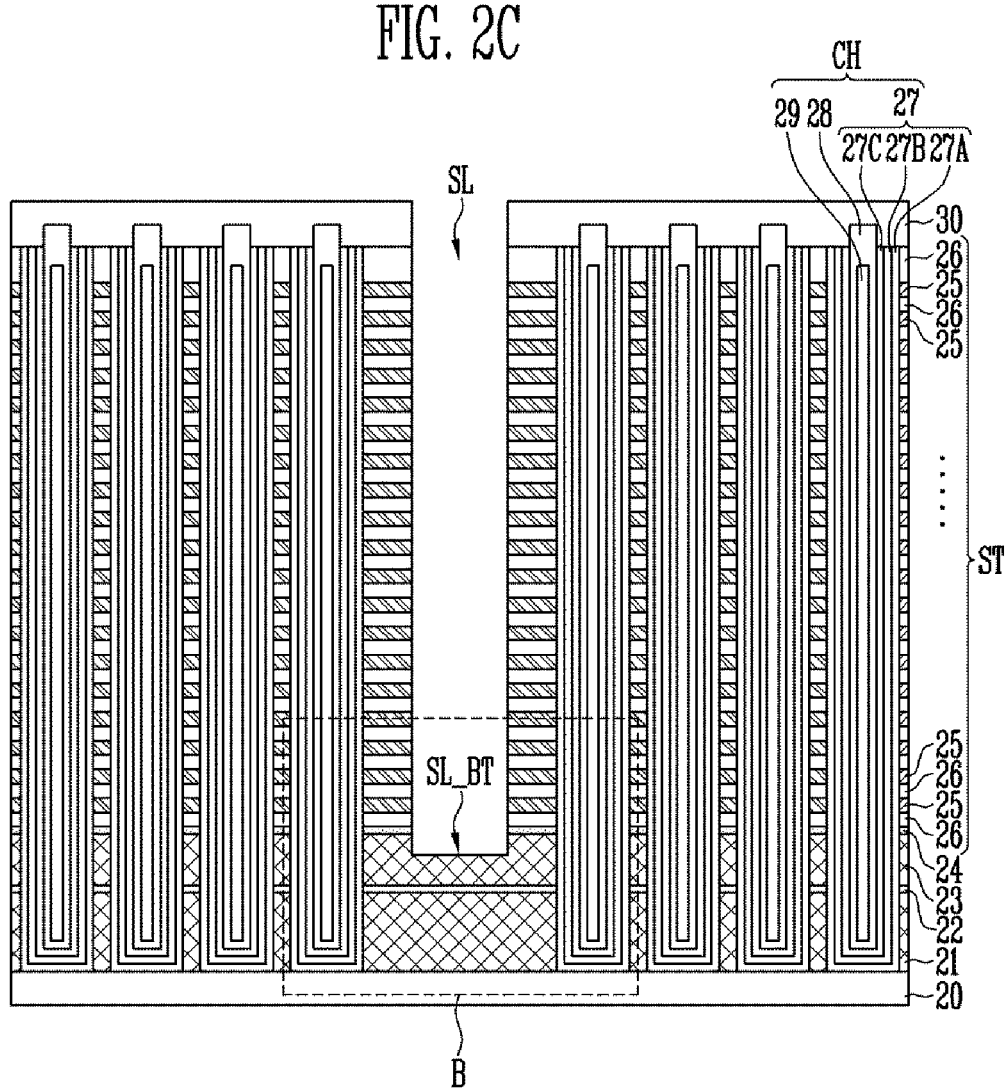

3D NON-VOLATILE SEMICONDUCTOR DEVICE AND MANUFACTURING METHOD OF THE DEVICE

CROSS-REFERENCE TO RELATED APPLICATION

The present application is a divisional application of U.S. patent application Ser. No. 16/863,608, filed on Apr. 30, 2020, and claims priority under 35 U.S.C. § 119(a) to Korean patent application number 10-2019-0153581, filed on Nov. 26, 2019, in the Korean Intellectual Property Office, the entire disclosure of which is incorporated herein by reference.

BACKGROUND

1. Technical Field

Various embodiments generally relate to an electronic device, and more particularly, to a semiconductor device and a method of manufacturing the semiconductor device.

2. Related Art

Non-volatile memory devices retain stored data in the absence of supplied power. The increase in integration density of two-dimensional non-volatile memory devices in which memory cells are formed in a single layer over a substrate has recently been limited. Thus, three-dimensional non-volatile memory devices have been proposed in which memory cells are stacked in a vertical direction over a substrate.

A three-dimensional non-volatile memory device may include interlayer insulating layers and gate electrodes alternately stacked with each other, with channel layers passing therethrough and memory cells may be stacked along the channel layers. Various structures and manufacturing methods have been developed to improve the operational reliability of three-dimensional non-volatile memory devices.

SUMMARY

According to an embodiment, a semiconductor device may include a source structure formed on a base, an etch prevention layer formed on the source structure, bit lines, a stack structure located between the etch prevention layer and the bit lines and including conductive layers and insulating layers that are alternately stacked on each other, and a channel structure passing through the stack structure and the etch prevention layer, wherein a lower portion of the channel structure is located in the source structure and a sidewall of the lower portion of the channel structure is in direct contact with the source structure.

According to an embodiment, a method of manufacturing a semiconductor device may include sequentially stacking and forming a first source layer, a sacrificial layer, and an etch prevention layer over a base, forming a stack structure including first material layers and second material layers that are alternately stacked on each other on the etch prevention layer, forming a channel structure passing through the stack structure, the etch prevention layer, and the sacrificial layer and extending into the first source layer, forming a slit passing through the stack structure and the etch prevention layer and exposing the sacrificial layer, and forming a second source layer directly coupled to the channel structure by removing the sacrificial layer exposed through the slit and filling a space from which the sacrificial layer is removed with a conductive material.

According to an embodiment, a method of manufacturing a semiconductor device may include sequentially stacking and forming a sacrificial layer and an etch prevention layer, forming a stack structure including first material layers and second material layers that are alternately stacked on each other over the etch prevention layer, forming a channel hole passing through the stack structure, the etch prevention layer, and the sacrificial layer, forming a channel structure including a channel layer and a memory layer that surrounds the channel layer in the channel hole, forming a slit passing through the stack structure and the etch prevention layer to expose the sacrificial layer, removing the sacrificial layer exposed through the slit to expose a part of the memory layer in a lower portion of the channel structure, removing an exposed part of the memory layer to expose the channel layer, and forming a second source layer directly coupled to the channel layer by filling a space from which the sacrificial layer is removed with a conductive material.

BRIEF DESCRIPTION OF THE DRAWINGS

FIGS. 2A, 2B, 2C, 2D, 2E, 2F, 2G, and 2H are cross-sectional diagrams illustrating a method of manufacturing a semiconductor device according to an embodiment;

DETAILED DESCRIPTION

Figure 1A:
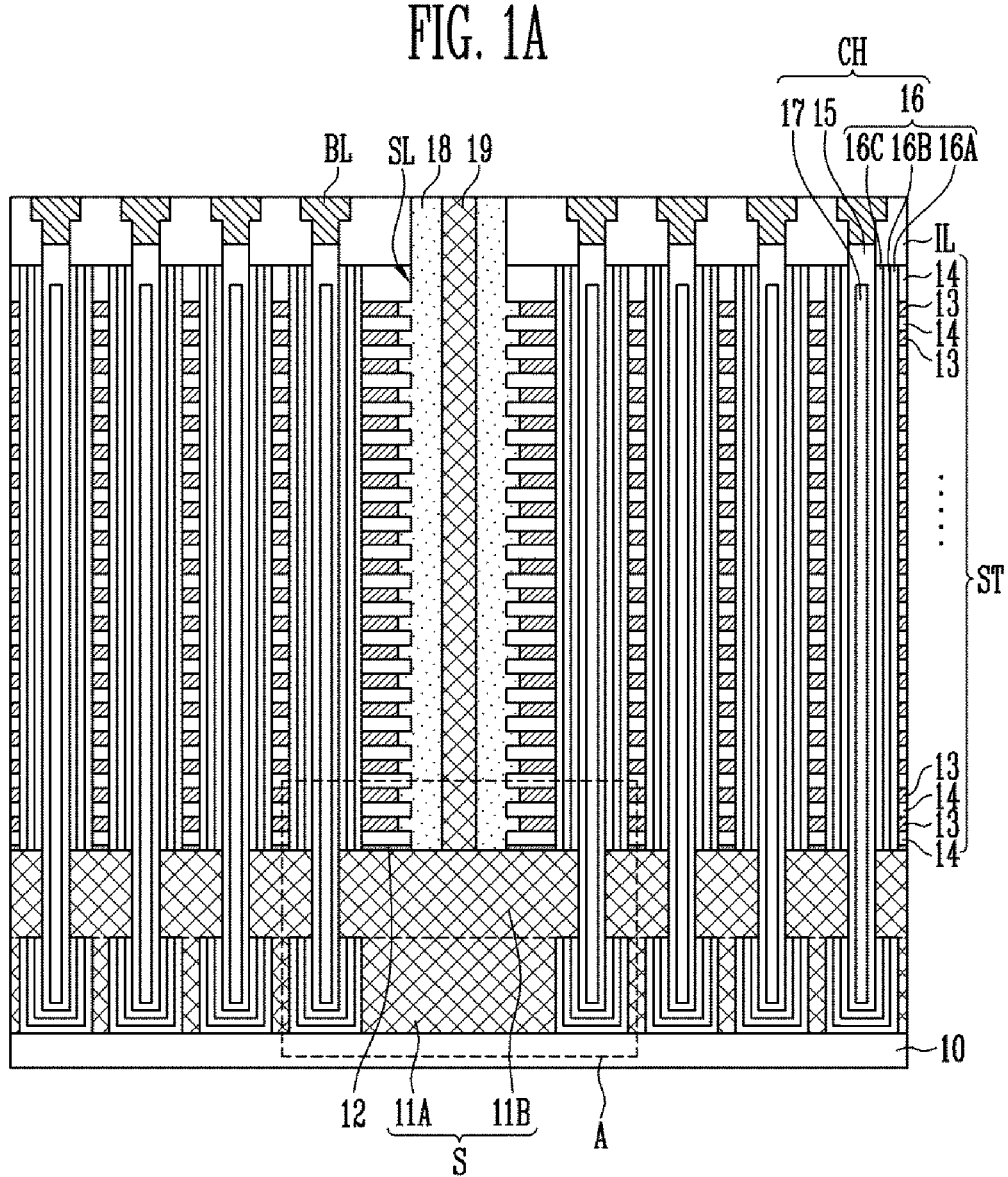
FIGS. 1A and 1B are cross-sectional diagrams illustrating the structure of a semiconductor device according to an embodiment.

Hereinafter, various embodiments are described with reference to the accompanying drawings. In the drawings, thicknesses and distances of components may be exaggerated compared to the actual physical thicknesses and distances for convenience of illustration. In the following description, a description of known related functions and constitutions may be omitted for simplicity and conciseness. Like reference numerals refer to like elements throughout the specification and drawings.

It is also noted that in this specification, "connected/coupled" refers to one component not only directly connected/coupled to another component but also indirectly connected/coupled to another component through an intervening component. When an element is referred to as being "directly on," "directly connected to" or "directly coupled to" another element or layer, there are no intervening elements or layers present. It is also understood that when a layer is referred to as being "on" another layer or substrate, it can be directly on the other or substrate, or intervening layers may also be present. In the specification, when an element is referred to as "comprising" or "including" a component, it does not exclude the inclusion of other additional components unless a description to the contrary is specifically pointed out in context.

Various embodiments may be directed to a semiconductor device with improved electrical characteristics and a method of manufacturing the semiconductor device.

Figure 1B:
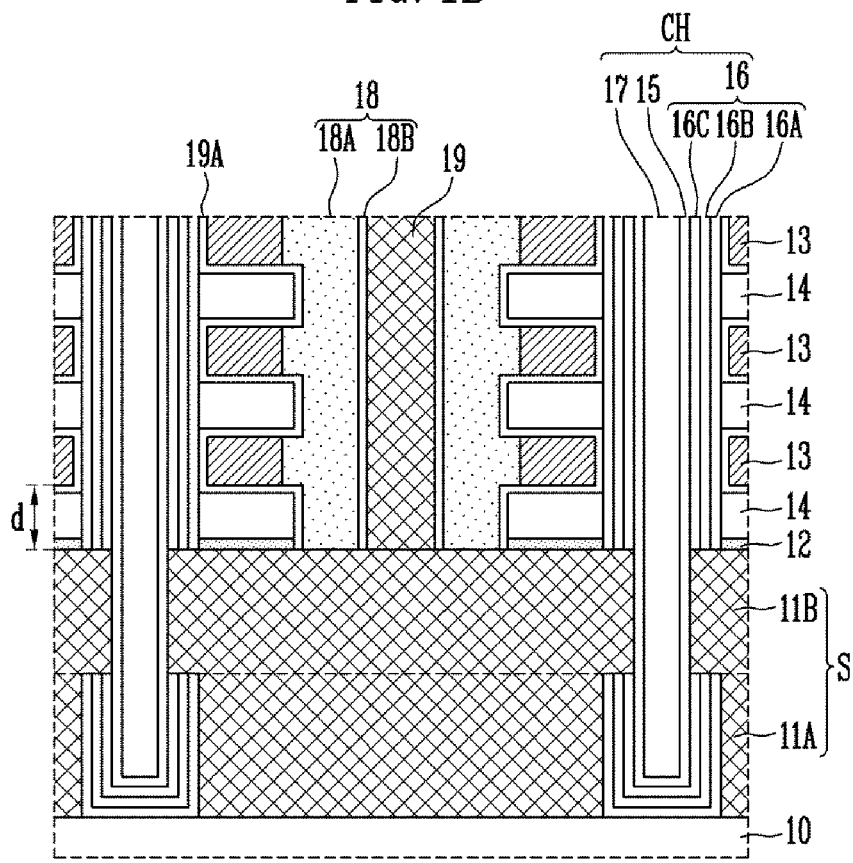

FIGS. 1A and 1B are cross-sectional diagrams illustrating the structure of a semiconductor device according to an embodiment. FIG. 1B is an enlarged view of region A of FIG. 1A.

Referring to FIG. 1A, the semiconductor device may include a source structure S, a stack structure ST, an etch prevention layer 12, a channel structure CH, a slit SL, and bit lines BL. In addition, the semiconductor device may further include at least one of a source contact structure 19, a spacer 18, and an interlayer insulating layer IL.

The source structure S may be a conductive layer including polysilicon, metal, or the like, and may be a single layer or a multilayer film. The source structure S may be located between a base 10 and the stack structure ST. The base 10 may be a semiconductor substrate, an insulating layer, or the like.

The source structure S may include a first source layer 11A and a second source layer 11B. The first source layer 11A may be located adjacent to the base 10 and the second source layer 11B may be located adjacent to the stack structure ST. The second source layer 11B may be in physical contact with a sidewall of a lower portion of the channel structure CH, and more specifically, may be in direct contact with a channel layer 15 of the lower portion of the channel structure CH. The first source layer 11A may be in contact with the lower portion of the channel structure CH, and more specifically, may be in direct contact with a memory layer 16 of the lower portion of the channel structure CH.

The stack structure ST may be located between the source structure S and the bit lines BL. The stack structure ST may include conductive layers 13 and insulating layers 14 alternately stacked on each other. The conductive layers 13 may be select lines, word lines, or the like. The insulating layers 14 may be provided to insulate the stacked conductive layers 13 from each other and may include an insulating material such as an oxide or a nitride.

The etch prevention layer 12 may be located in an interface between the source structure S and the stack structure ST. The etch prevention layer 12 may include silicon carbonitride (SiCN). The etch prevention layer 12 may prevent the stack structure ST from being etched during an etching process for exposing the channel layer 15 of the lower portion of the channel structure CH.

The channel structure CH may be coupled between the bit lines BL and the source structure S. The channel structure CH may pass through the stack structure ST and extend into the source structure S. The channel structure CH may include the channel layer 15, and may further include at least one of the memory layer 16 and a gap-fill layer 17. The channel layer 15 located in the lower portion of the channel structure CH may be physically coupled to the source structure S through the sidewall thereof. For example, the channel layer 15 located in the lower portion of the channel structure CH may be physically coupled to the second source layer 11B through the sidewall of the channel layer 15. The channel layer 15 may include a semiconductor material such as silicon (Si) or germanium (Ge). The memory layer 16 may surround the sidewall of the channel layer 15. The memory layer 16 may include at least one of a charge blocking layer 16A, a data storage layer 16B, and a tunnel insulating layer 16C. The data storage layer 16B may include a floating gate, a charge trapping material, polysilicon, a nitride, a variable resistance material, a phase-change material, nanodots, or the like. The gap-fill layer 17 may be formed in the channel layer 15. The gap-fill layer 17 may include an oxide layer.

A select transistor or a memory cell may be located in each of intersections of the channel structure CH and the conductive layers 13. A select transistor and a memory cell sharing the single channel layer 15 may form a single memory string. The memory string may include at least one drain select transistor, a plurality of memory cells, and at least one source select transistor coupled in series with each other.

The source contact structure 19 may pass through the stack structure ST to be coupled to the source structure S. The source contact structure 19 may be a conductive layer including polysilicon, metal, or the like. The source contact structure 19 may be a single layer or a multilayer film.

The spacer 18 may be interposed between the source contact structure 19 and the stack structure ST. The spacer 18 may be formed on the inner wall of the slit SL and may surround the sidewall of the source contact structure 19. The spacer 18 may include an insulating layer and may be a single layer or a multilayer film.

Referring to FIG. 1B, the source structure S may include the first source layer 11A stacked on the base 10 and the second source layer 11B stacked on the first source layer 11A. The first source layer 11A may surround the lower end of the channel structure CH and the second source layer 11B may surround a part of the lower portion of the channel structure CH where the channel layer 15 is exposed and may be in direct contact with the channel layer 15.

The first source layer 11A and the second source layer 11B may include a conductive layer such as a polysilicon layer, and may include an N-type or P-type dopant. For example, when an erase operation is performed by a Gate Induced Drain Leakage (GIDL) method, the first source layer 11A and the second source layer 11B may include an N-type dopant such as phosphorus (P).

The etch prevention layer 12 may be interposed in an interface between the second source layer 11B and the stack structure ST. The etch prevention layer 12 may include silicon carbonitride (SiCN). The etch prevention layer 12 may prevent the stack structure ST from being etched during an etching process for exposing the channel layer 15 of the lower portion of the channel structure CH. Accordingly, the thickness of the lowermost insulating layer 14 of the stack structure ST may be reduced. Accordingly, a distance d between the source structure S and the conductive layer 13 that serves as a select transistor may be reduced. Thus, a distance by which impurities doped to the source structure S diffuse may be minimized and a junction overlap region may be easily formed, such that a Gate Induced Drain Leakage (GIDL) current may be stably generated during an erase operation. In addition, off characteristics of the select transistor may be improved, such that the semiconductor device may be designed to minimize the number of select transistors to be disposed and the integration density of the semiconductor device may also be improved.

The channel structure CH may pass through the stack structure (i.e., conductive layers 13 and insulating layers 14) and the etch prevention layer 12 and extend into the source structure S. For example, the lower portion of the channel structure CH may pass through the second source layer 11B and penetrate the first source layer 11A by a predetermined thickness. FIG. 1B illustrates that the lower portion of the channel structure CH passes through the first source layer 11A to be in contact with the base 10. Alternatively, however, the lower portion of the channel structure CH may pass through a part of the first source layer 11A by a predetermined thickness, such that the first source layer 11A surrounds the lower portion of the channel structure CH. The channel structure CH may include the channel layer 15, and may further include at least one of the memory layer 16 and the gap-fill layer 17. The channel layer 15 may include a semiconductor material such as silicon (Si) or germanium (Ge). The memory layer 16 may surround the sidewall of the channel layer 15. The memory layer 16 may include at least one of the charge blocking layer 16A, the data storage layer 16B, and the tunnel insulating layer 16C. The data storage layer 16B may include a floating gate, a charge trapping material, polysilicon, a nitride, a variable resistance material, a phase-change material, nanodots, or the like. The gap-fill layer 17 may be formed in the channel layer 15. The gap-fill layer 17 may include an oxide layer. A part of the channel layer 15 that passes through the second source layer 11B, among the lower portion of the channel structure CH, may be exposed to be in direct contact with the second source layer 11B. In other words, the memory layer 16 surrounding the channel layer 15 might not be interposed between the second source layer 11B and the part of the channel layer 15 that passes through the second source layer 11B, among the lower portion of the channel structure CH. Thus, the part of the channel layer 15 that passes through the second source layer 11B may be in direct contact with the second source layer 11B.

A select transistor or a memory cell may be located in each of intersections of the channel structure CH and the conductive layers 13. A select transistor and a memory cell sharing the single channel layer 15 may form a single memory string. A memory string may include at least one drain select transistor, a plurality of memory cells, and at least one source select transistor coupled in series with each other.

The spacer 18 may be a multilayer film including a first spacer 18A and a second spacer 18B. The first spacer 18A may include a material having a different etch rate from the second spacer 18B. For example, the first spacer 18A may include an oxide layer and the second spacer 18B may include a nitride layer. A thickness of the second spacer 18B may be smaller than a thickness of the first spacer 18A. The second spacer 18B may be interposed between the first spacer 18A and the source contact structure 19.

The semiconductor device may further include memory layers 19A. The memory layers 19A may be interposed between the conductive layers 13 and the insulating layers 14 and between the conductive layers 13 and the channel structure CH.

FIGS. 2A to 2H are cross-sectional diagrams illustrating a method of manufacturing a semiconductor device according to an embodiment. FIGS. 2D to 2H are enlarged views of region B of FIG. 2C and illustrate cross sections according to subsequent processes of a process illustrated in FIG. 2C. Hereinafter, any repetitive description of components already mentioned above will be omitted.

Figure 2A:
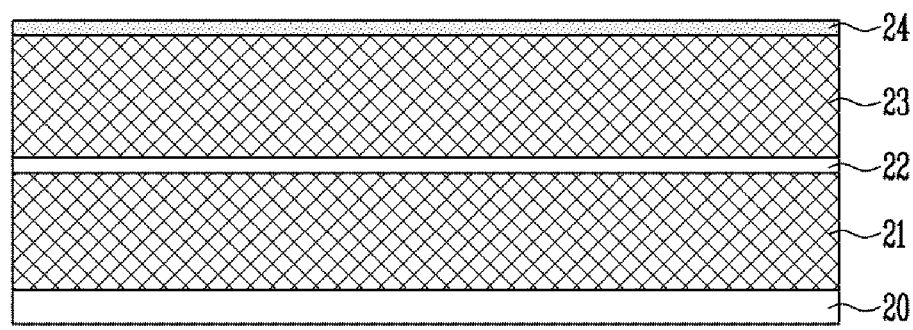

Referring to FIG. 2A, a first source layer 21, a buffer layer 22, and a sacrificial layer 23 may be sequentially formed over a base 20. The first source layer 21 may include a polysilicon layer. The first source layer 21 may include an N-type or P-type impurity. The buffer layer 22 may include a nitride layer. The sacrificial layer 23 may include a polysilicon layer.

Subsequently, an upper portion of the sacrificial layer 23 may be planarized by performing a planarization process and an etch prevention layer 24 may be formed on the sacrificial layer 23. The etch prevention layer 24 may include silicon carbonitride (SiCN).

Figure 2B:
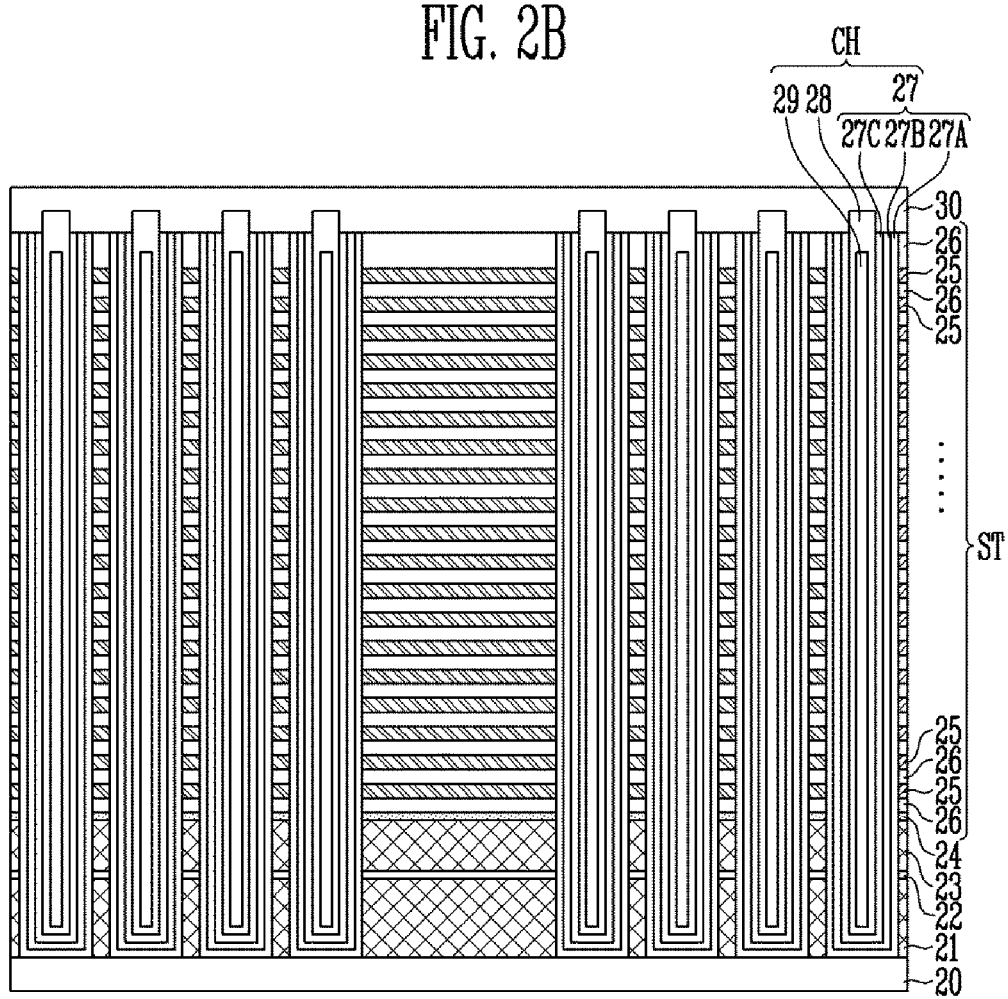

Referring to FIG. 2B, the stack structure ST may be formed on the etch prevention layer 24. The stack structure ST may include first material layers 25 and second material layers 26 alternately stacked on each other. The first material layers 25 may be configured to form gate electrodes of memory cells, select transistors, or the like. The second material layers 26 may be configured to insulate the stacked gate electrodes from each other. The first material layers 25 may include a material having high etch selectivity with respect to the second material layers 26. For example, the first material layers 25 may be sacrificial layers including a nitride, or the like and the second material layers 26 may be insulating layers including an oxide, or the like. Alternatively, the first material layers 25 may be conductive layers including polysilicon, tungsten, or the like, and the second material layers 26 may be insulating layers including an oxide, or the like.

Subsequently, the channel structures CH passing through the stack structure ST, the etch prevention layer 24, the sacrificial layer 23, the buffer layer 22, and the first source layer 21 may be formed. The channel structures CH may pass through the first source layer 21 to be in contact with the base 20 or may penetrate a part of the first source layer 21 by a predetermined thickness, such that the bottom surfaces of the channel structures CH may be located in the first source layer 21.

A method of forming the channel structures CH is as below. First, channel holes passing through the stack structure ST, the etch prevention layer 24, the sacrificial layer 23, and the buffer layer 22 and penetrating a part of the first source layer by at least a predetermined thickness may be formed. Subsequently, memory layers 27 may be formed in the channel holes, respectively. Each of the memory layers 27 may include at least one of a charge blocking layer 27A, a data storage layer 27B, and a tunnel insulating layer 27C. Subsequently, channel layers 28 may be formed in the channel holes, respectively. The channel layers 28 may include gap-fill layers 29, respectively. Subsequently, an interlayer insulating layer 30 may be formed on the stack structure ST.

Referring to FIG. 2C, the slit SL may be formed. The slit SL may pass through the stack structure ST and the etch prevention layer 24. A bottom surface SL_BT of the slit SL might not completely pass through the sacrificial layer 23 but may be located in the sacrificial layer 23. The slit SL may be formed by sequentially etching the interlayer insulating layer 30, the stack structure ST, and the etch prevention layer 24 to expose a part of the sacrificial layer 23.

Figure 2D:
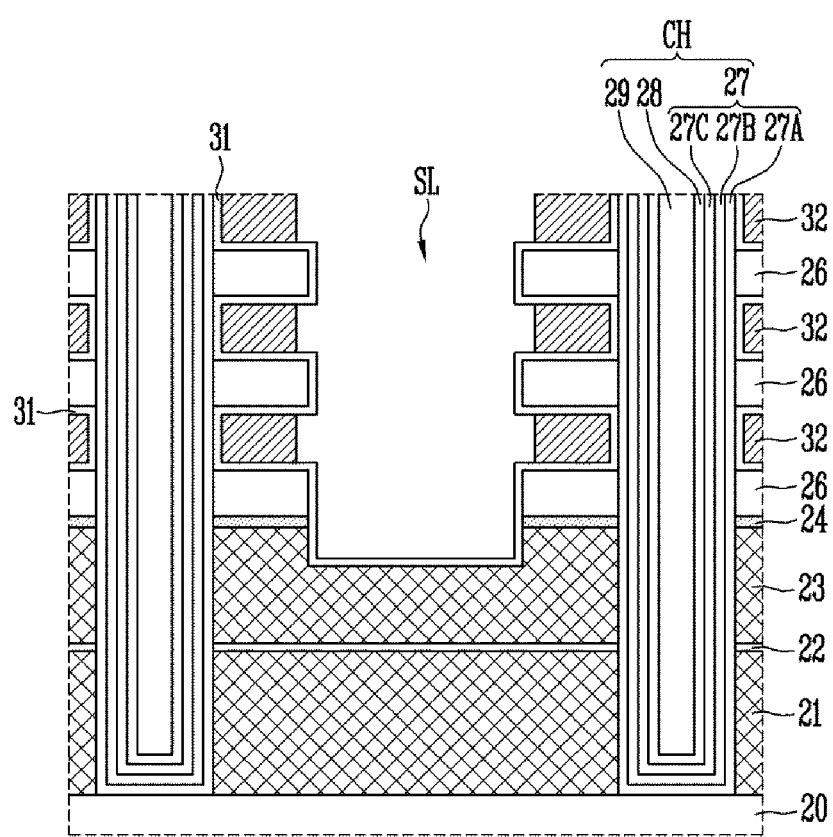

Referring to FIG. 2D, the first material layers 25 may be replaced by third material layers 32 through the slit SL. According to an embodiment, when the first material layers 25 are sacrificial layers and the second material layers 26 are insulating layers, the first material layers 25 may be replaced by conductive layers. For example, the first material layers 25 exposed through the slit SL may be removed and a space from which the first material layers 25 are removed may be filled with a conductive material to form conductive layers (i.e., the third material layers 32). More specifically, the first material layers 25 exposed through the slit SL may be removed and a blocking layer 31 may be formed along a surface of the entire structure from which the first material layers 25 are removed. Subsequently, a conductive material may be formed in the slit SL, and the conductive material formed in the slit SL may be etched to form conductive layers (i.e., the third material layers 32). The stacked conductive layers may be electrically separated from each other by an etching process. According to another embodiment, when the first material layers 25 are conductive layers and the second material layers 26 are insulating layers, the first material layers 25 may be silicided.

Figure 2E:
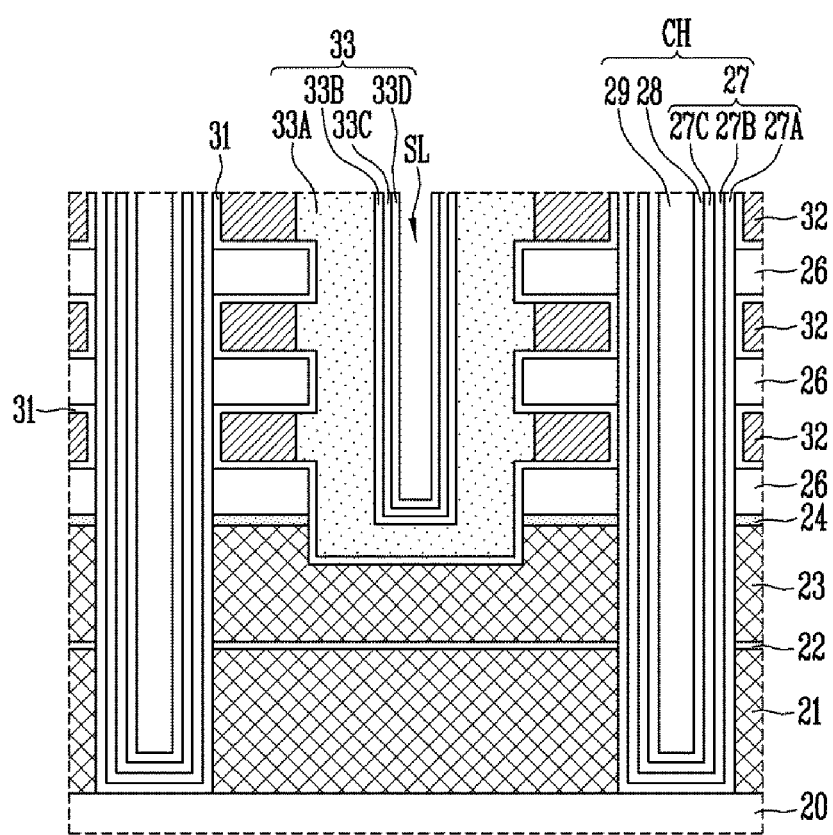

Referring to FIG. 2E, a spacer 33 may be formed in the slit SL. The spacer 33 may be a multilayer film in which layers having different etch rates are alternately stacked on each other. For example, a first spacer layer 33A, a second spacer layer 33B, a third spacer layer 33C, and a fourth spacer layer 33D may be sequentially formed along a profile of the slit SL. The second and fourth spacer layers 33B and 33D may include a material having high etch selectivity with respect to the first and third spacer layers 33A and 33C. The first spacer layer 33A and the third spacer layer 33C may include an oxide layer. The second spacer layer 33B and the fourth spacer layer 33D may include a nitride layer.

Figure 2F:
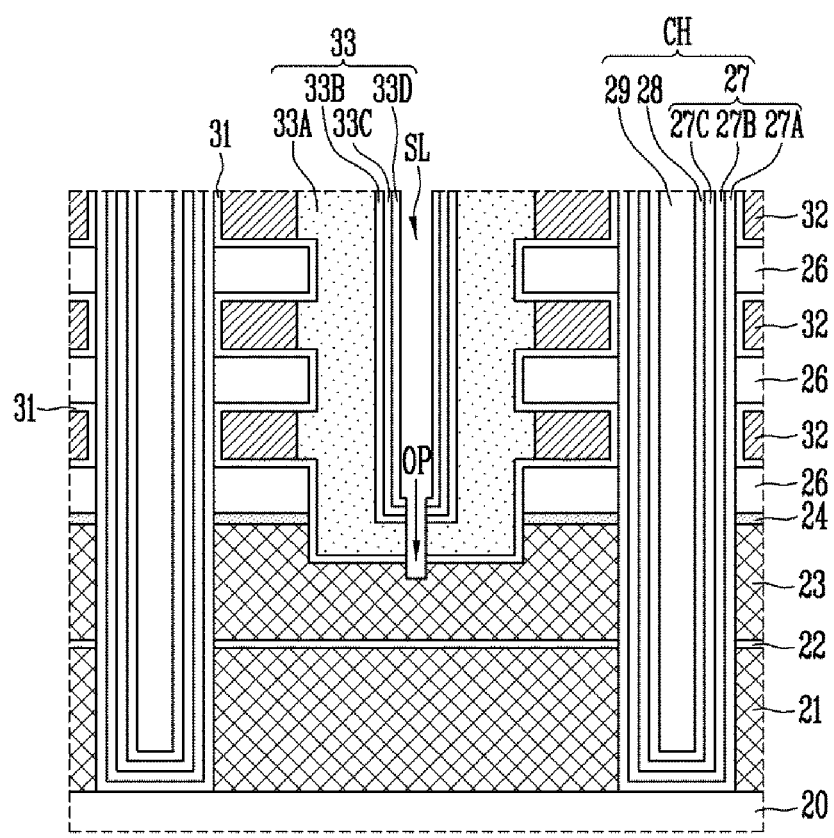

Referring to FIG. 2F, an opening OP exposing the sacrificial layer 23 may be formed by etching the first, second, third, and fourth spacer layers 33A, 33B, 33C, and 33D and the blocking layer 31 formed over the bottom surface of the slit SL using an etch-back process.

Figure 2G:
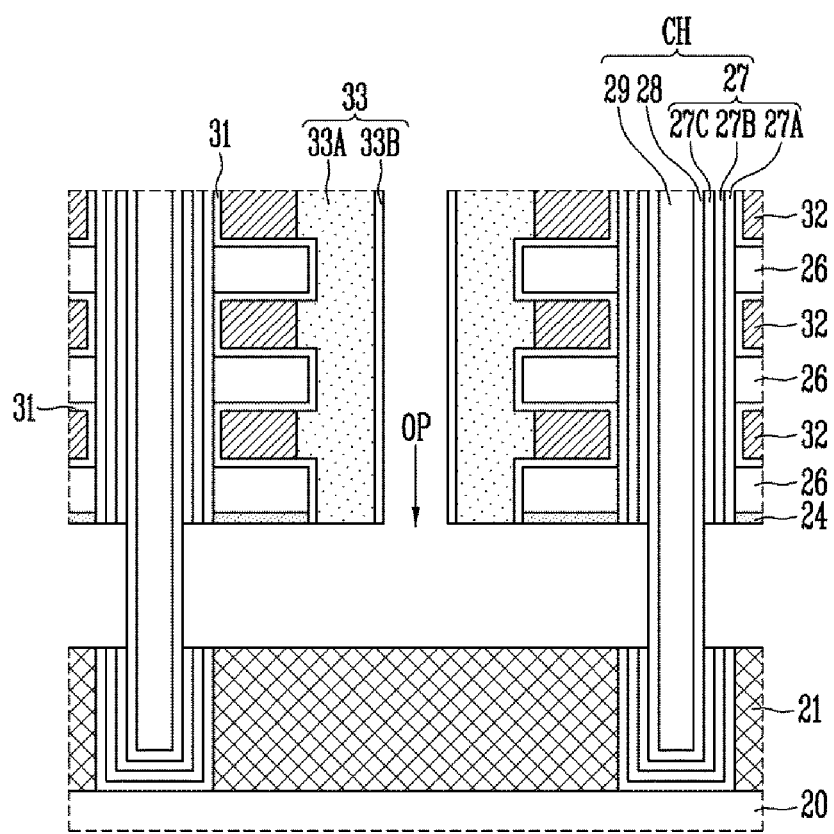

Referring to FIG. 2G, the sacrificial layer 23 exposed through the opening OP may be removed. Accordingly, a part of a sidewall of the lower portion of the channel structure CH may be exposed. Subsequently, the charge blocking layer 27A, the data storage layer 27B, and the tunnel insulating layer 27C of the exposed part of the channel structure CH may be sequentially removed. When the data storage layer 27B is removed, the fourth spacer layer 33D may also be removed at the same time. For example, in an embodiment, when the data storage layer 27B is removed and the fourth spacer layer 33D is removed at the same time means that if removal of the data storage layer 27B takes place over a first interval of time and removal of the fourth spacer layer 33D takes place over a second interval of time, then the first and second intervals at least partially overlap each other such that there exists a time at which the removal of the fourth spacer layer 33D and the removal of the data storage layer 27B are both taking place. When the tunnel insulating layer 27C is removed, the third spacer layer 33C may also be removed at the same time. For example, in an embodiment, when the tunnel insulating layer 27C is removed and the third spacer layer 33C is removed at the same time means that if removal of the tunnel insulating layer 27C takes place over a first interval of time and removal of the third spacer layer 33C takes place over a second interval of time, then the first and second intervals at least partially overlap each other such that there exists a time at which the removal of the third spacer layer 33C and the removal of the tunnel insulating layer 27C are both taking place. In an embodiment, when an exposed part of the memory layer 27 is removed and the third and fourth spacer layers 33C and 33D are removed at the same time means that if removal of the memory layer 27 takes place over a first interval of time and removal of the third and fourth spacer layers 33C and 33D takes place over a second interval of time, then the first and second intervals at least partially overlap each other such that there exists a time at which the removal of the third and fourth spacer layers 33C and 33D and the removal of the memory layer 27 are both taking place. Accordingly, a part of the channel layer 28 of the lower portion of the channel structure CH may be exposed. When the sacrificial layer 23, the charge blocking layer 27A, the data storage layer 27B, and the tunnel insulating layer 27C are sequentially removed by an etching process, the second material layers 26 located in the lowermost layer of the stack structure ST may be protected by the etch prevention layer 24. Accordingly, it might not need to form the second material layers 26 located in the lowermost layer of the stack structure ST to have a great thickness or form an additional source layer between the sacrificial layer 23 and the stack structure ST such that the stack structure is prevented from being damaged during an etching process.

Figure 2H:
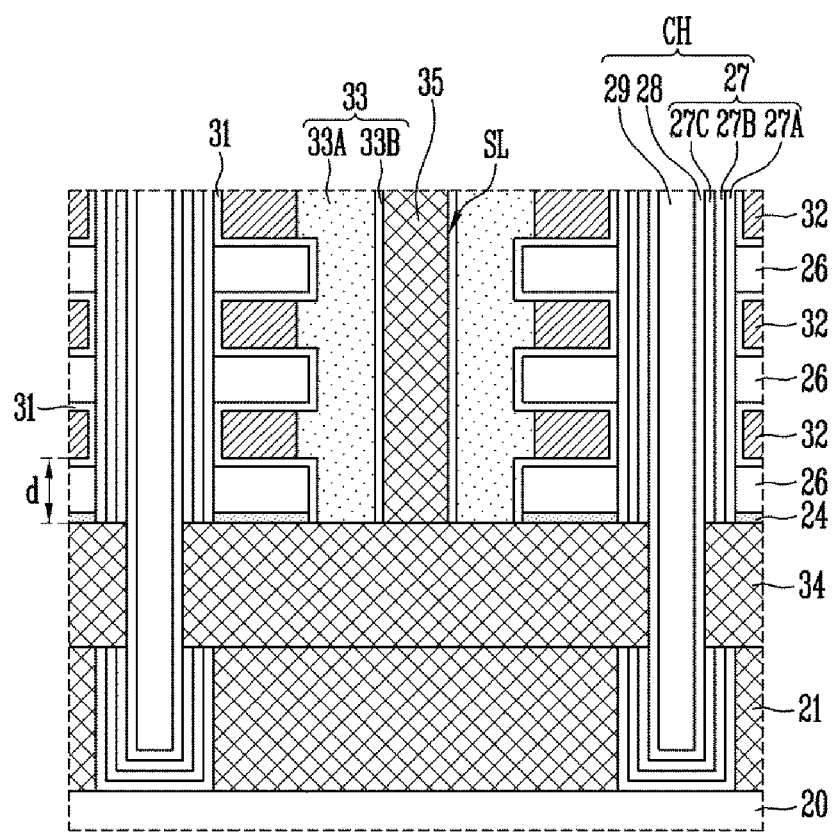

Referring to FIG. 2H, a second source layer 34 may be formed in a space from which the sacrificial layer is removed and a source contact structure 35 located in the slit SL may be formed. Each of the second source layer 34 and the source contact structure 35 may be a single layer. For example, the second source layer 34 and the source contact structure 35 may be formed by depositing a conductive material in the opening OP and the slit SL. The conductive material may include a polysilicon layer, a metal layer, and the like. The second source layer 34 and the source contact structure 35 may include a dopant. The second source layer 34 may be in direct contact with exposed parts of the channel layers 28 of the channel structures CH.

According to the embodiments described above, an etch prevention layer may be formed in an interface between a sacrificial layer and the stack structure ST, such that the stack structure ST may be prevented from being etched during an etching process for exposing the channel layer 28 of the lower portion of the channel structure CH. Accordingly, the distance d between the conductive layer (32) that serves as a select transistor and the second source layer 34 may be reduced. Thus, a distance by which impurities, doped to a source structure, diffuse may be minimized and a junction overlap region may be easily formed, such that a GIDL current may be stably generated during an erase operation. In addition, off characteristics of the select transistor may be improved, such that the semiconductor device may be designed to minimize the number of select transistors to be disposed and the integration density of the semiconductor device may also be improved.

Figure 3:
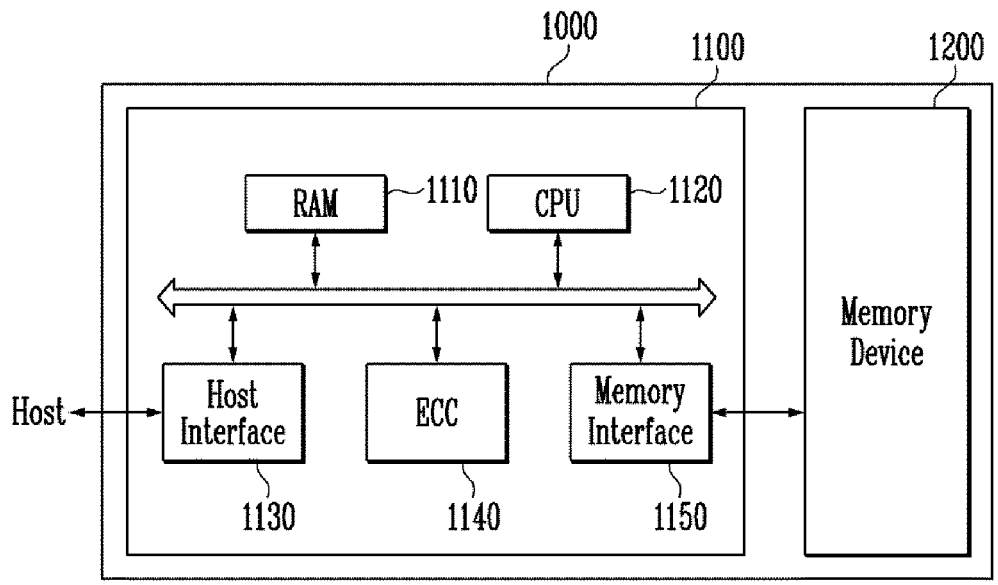
FIG. 3 is a block diagram illustrating the configuration of a memory system according to an embodiment.

FIG. 3 is a block diagram illustrating the configuration of a memory system 1000 according to an embodiment.

Referring FIG. 3, the memory system 1000 according to an embodiment includes a memory device 1200 and a controller 1100.

The memory device 1200 may be used to store data information having various data formats such as a text format, a graphical format, and a software code format. The memory device 1200 may be a non-volatile memory device. Furthermore, the memory device 1200 may have the structures described above with reference to FIGS. 1A and 1B, and may be manufactured by the manufacturing methods described above with reference to FIGS. 2A to 2H. Because the memory device 1200 is configured and manufactured in the same manner as described above, a detailed description thereof will be omitted.

The controller 1100 may be coupled to a host and the memory device 1200 and configured to access the memory device 1200 in response to a request from the host. For example, the controller 1100 may control read, write, erase, and background operations of the memory device 1200.

The controller 1100 may include Random Access Memory (RAM) 1110, a Central Processing Unit (CPU) 1120, a host interface 1130, an Error Correction Code (ECC) circuit 1140, a memory interface 1150, and the like.

The RAM 1110 may serve as operational memory of the CPU 1120, cache memory between the memory device 1200 and the host, buffer memory between the memory device 1200 and the host, or the like. The RAM 1110 may be replaced with Static Random Access Memory (SRAM), Read Only Memory (ROM), or the like.

The CPU 1120 may control the overall operations of the controller 1100. For example, the CPU 1120 may operate firmware such as a Flash Translation Layer (FTL) stored in the RAM 1110.

The host interface 1130 may interface with the host. For example, the controller 1100 may communicate with the host through at least one of various interface protocols such as a Universal Serial Bus (USB) protocol, a MultiMedia Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, and a private protocol.

The ECC circuit 1140 may use an error correction code (ECC) to detect and correct errors in data read from the memory device 1200.

The memory interface 1150 may interface with the memory device 1200. For example, the memory interface 1150 may include a NAND interface or a NOR interface.

The controller 1100 may further include buffer memory (not shown) for temporarily storing data. The buffer memory may be used to temporarily store data to be transferred to an external device through the host interface 1130 or data to be transferred from the memory device 1200 through the memory interface 1150. The controller 1100 may further include ROM which stores code data to interface with the host.

Figure 4:
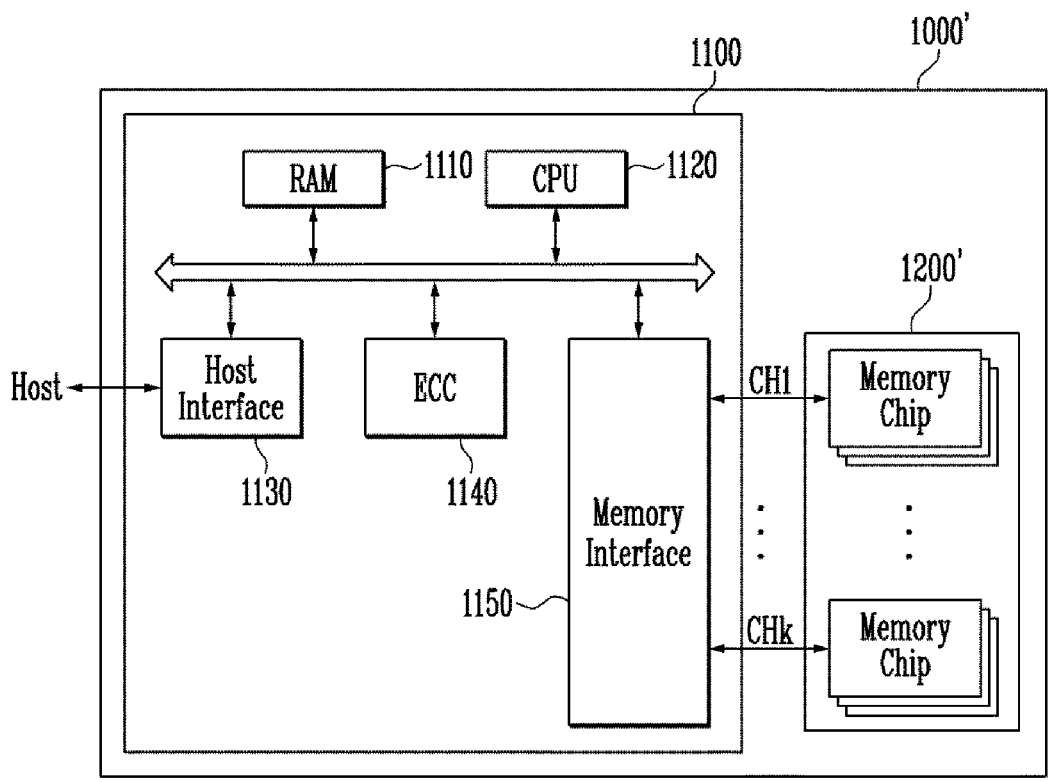
FIG. 4 is a block diagram illustrating the configuration of a memory system according to an embodiment.

FIG. 4 is a block diagram illustrating the configuration of a memory system 1000' according to an embodiment. Hereinafter, any repetitive description of components already mentioned above will be omitted.

Referring to FIG. 4, the memory system 1000' according to an embodiment may include a memory device 1200' and the controller 1100. In addition, the controller 1100 may include the RAM 1110, the CPU 1120, the host interface 1130, the ECC circuit 1140, the memory interface 1150, and the like.

The memory device 1200' may be a non-volatile memory device. Furthermore, the memory device 1200' may have the structures described above with reference to FIGS. 1A and 1B, and may be manufactured by the manufacturing methods described above with reference to FIGS. 2A to 2H. Because the memory device 1200' is configured and manufactured in the same manner as described above, a detailed description thereof will be omitted.

Furthermore, the memory device 1200' may be a multi-chip package including a plurality of memory chips. The plurality of memory chips may be divided into a plurality of groups, which may communicate with the controller 1100 through first to kth channels CH1 to CHk, respectively. In addition, memory chips included in a single group may be suitable for communicating with the controller 1100 through a common channel. The memory system 1000' may be modified so that a single memory chip may be coupled to a single channel.

Because the memory device 1200' is formed into a multi-chip package, data storage capacity and a driving speed of the memory system 1000' may be increased.

Figure 5:
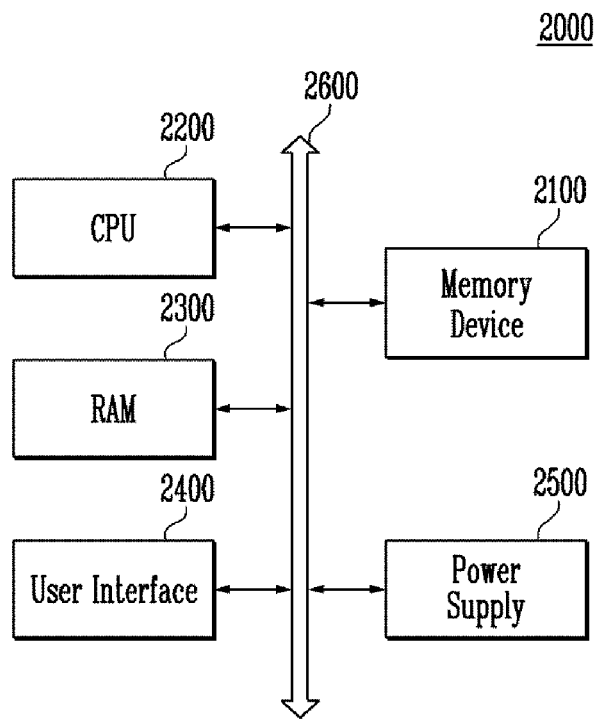
FIG. 5 is a block diagram illustrating the configuration of a computing system according to an embodiment.

FIG. 5 is a block diagram illustrating the configuration of a computing system 2000 according to an embodiment. Hereinafter, any repetitive description of components already mentioned above will be omitted.

Referring to FIG. 5, the computing system 2000 according to an embodiment may include a memory device 2100, a CPU 2200, RAM 2300, a user interface 2400, a power supply 2500, a system bus 2600, and the like.

The memory device 2100 may store data provided via the user interface 2400, data processed by the CPU 2200, and the like. The memory device 2100 may be electrically coupled to the CPU 2200, the RAM 2300, the user interface 2400, and the power supply 2500 through the system bus 2600. For example, the memory device 2100 may be coupled to the system bus 2600 through a controller (not shown), alternatively, directly coupled to the system bus 2600. When the memory device 2100 is directly coupled to the system bus 2600, functions of the controller may be performed by the CPU 2200 and the RAM 2300.

The memory device 2100 may be a non-volatile memory device. Furthermore, the memory device 2100 may have the structures described above with reference to FIGS. 1A and 1B, and may be manufactured by the manufacturing methods described above with reference to FIGS. 2A to 2H.

In addition, as described above with reference to FIG. 4, the memory device 2100 may be a multi-chip package including a plurality of memory chips.

The computing system 2000 having the above-described configuration may be provided as a computer, an Ultra Mobile PC (UMPC), a workstation, a net-book, Personal Digital Assistants (PDAs), a portable computer, a web tablet, a wireless phone, a mobile phone, a smartphone, an e-book, a Portable Multimedia Player (PMP), a portable game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, an RFID device, or the like.

Figure 6:
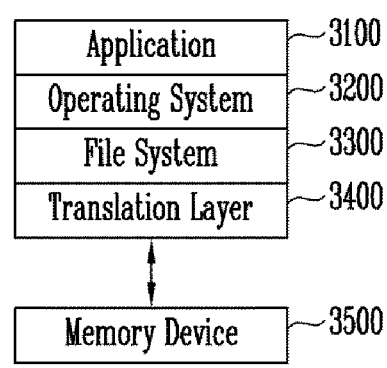
FIG. 6 is a block diagram illustrating a computing system according to an embodiment.

FIG. 6 is a block diagram illustrating a computing system 3000 according to an embodiment.

Referring to FIG. 6, the computing system 3000 according to an embodiment may include a software layer that includes an operating system 3200, an application 3100, a file system 3300, and a translation layer 3400. Furthermore, the computing system 3000 may include a hardware layer such as a memory device 3500.

The operating system 3200 may manage software and hardware resources of the computing system 3000. The operating system 3200 may control program execution of a central processing unit. The application 3100 may be various application programs executed in the computing system 3000. The application 3100 may be a utility executed by the operating system 3200.

The file system 3300 may refer to a logical structure configured to manage data and files present in the computing system 3000. The file system 3300 may organize files or data to be stored in the memory device 3500 according to given rules. The file system 3300 may be determined according to the operating system 3200 used in the computing system 3000. For example, when the operating system 3200 is a Microsoft Windows-based system, the file system 3300 may be a File Allocation Table (FAT), an NT file system (NTFS), or the like. In addition, when the operating system 3200 is a Unix/Linux-based system, the file system 3300 may be an extended file system (EXT), a Unix File System (UFS), a Journaling File System (JFS), or the like.

FIG. 6 illustrates the operating system 3200, the application 3100, and the file system 3300 in separate blocks.

However, the application 3100 and the file system 3300 may be included in the operating system 3200.

The translation layer 3400 may translate an address into a suitable form for the memory device 3500 in response to a request from the file system 3300. For example, the translation layer 3400 may translate a logical address, generated by the file system 3300, into a physical address of the memory device 3500. Mapping information of the logical address and the physical address may be stored in an address translation table. For example, the translation layer 3400 may be a Flash Translation Layer (FTL), a Universal Flash Storage Link Layer (ULL), or the like.

The memory device 3500 may be a non-volatile memory device. Furthermore, the memory device 3500 may have the structures described above with reference to FIGS. 1A and 1B, and may be manufactured by the manufacturing methods described above with reference to FIGS. 2A to 2H.

The computing system 3000 having the above-described configurations may be divided into an operating system layer that is operated in an upper level region and a controller layer that is operated in a lower level region. The application 3100, the operating system 3200, and the file system 3300 may be included in the operating system layer, and may be driven by operational memory of the computing system 3000. The translation layer 3400 may be included in the operating system layer or the controller layer.

As described above, according to the present disclosure, the electrical characteristics of a semiconductor device may be improved by reducing a distance by which an impurity of a source structure coupled to a lower portion of a channel of the semiconductor device diffuses.

Embodiments have been disclosed herein, and although specific terms are employed, they are used and are to be interpreted in a generic and descriptive sense only and not for the purpose of limitation. Accordingly, it will be understood by a person of ordinary skill in the art to which the disclosure pertains that various changes in forms and details may be made without departing from the spirit and scope of the descriptions as set forth in the following claims.

What is claimed is:

1. A semiconductor device, comprising:
   a source structure formed over a base;
   an etch prevention layer formed over the source structure;
   bit lines;
   a stack structure located between the etch prevention layer and the bit lines and including conductive layers and insulating layers that are alternately stacked on each other;
   a channel structure extending in a vertical direction in the stack structure and the etch prevention layer;
   a slit extending in the vertical direction in the stack structure and the etch prevention layer;
   a spacer formed along an inner wall of the slit; and
   a source contact structure formed along an inner wall of the spacer,
   wherein a lower portion of the channel structure is located in the source structure and a sidewall of the lower portion of the channel structure is in direct contact with the source structure,
   the source contact structure and the etch prevention layer are physically separated from each other by the spacer, and
   the conductive layers correspond to at least one source select line and a plurality of word lines.

2. The semiconductor device of claim 1, wherein the etch prevention layer includes silicon carbonitride (SiCN).

3. The semiconductor device of claim 1, wherein the source structure comprises:
   a first source layer formed over the base; and
   a second source layer located between the first source layer and the etch prevention layer and in direct contact with the lower portion of the channel structure.

4. The semiconductor device of claim 3, wherein the etch prevention layer is interposed in an interface between the between the second source layer and the stack structure.

5. The semiconductor device of claim 3,
   wherein the channel structure includes a gap-fill layer, a channel layer, and a memory layer,
   wherein the channel layer is formed over a sidewall of the gap-fill layer,
   wherein the memory layer is formed over a sidewall of the channel layer, and
   wherein the gap-fill layer extending in the vertical direction in the stack structure, the etch prevention layer, and the second source layer.

6. The semiconductor device of claim 5, wherein a part of the channel layer of the lower portion of the channel structure is exposed, and an exposed part of the channel layer is in direct contact with the second source layer.

7. The semiconductor device of claim 5, wherein the lower portion of the channel structure extends into the first source layer and the first source layer is in contact with the memory layer.

8. The semiconductor device of claim 1, wherein the source structure includes a polysilicon layer including one of an N-type and P-type dopant.

* * * * *